(12) United States Patent
Manna et al.

(10) Patent No.: US 7,135,743 B2
(45) Date of Patent: Nov. 14, 2006

(54) ELECTROSTATIC DISCHARGE PROTECTION DEVICE WITH COMPLEMENTARY DUAL DRAIN IMPLANT

(75) Inventors: Indrajit Manna, Singapore (SG); Keng Foo Lo, Singapore (SG); Pee Ya Tan, Singapore (SG); Michael Cheng, Singapore (SG)

(73) Assignees: Chartered Semiconductor Manufacturing Ltd., Singapore (SG); Agilent Technologies, Inc., Singapore (SG)

( * ) Notice: Subject to any disclaimer, the term of this patent is extended or adjusted under 35 U.S.C. 154(b) by 0 days.

(21) Appl. No.: 11/291,757

(22) Filed: Dec. 1, 2005

(65) Prior Publication Data

US 2006/0081933 A1 Apr. 20, 2006

Related U.S. Application Data

(62) Division of application No. 10/662,673, filed on Sep. 15, 2003, now Pat. No. 6,998,685.

(51) Int. Cl.
*H01L 23/62* (2006.01)

(52) U.S. Cl. ............... 257/357; 257/356; 257/355; 257/E21.632

(58) Field of Classification Search ............... 257/355, 257/356, 357, E21.632
See application file for complete search history.

(56) References Cited

U.S. PATENT DOCUMENTS 4,213,140 A * 7/1980 Okabe et al. ............... 257/357
5,543,650 A    8/1996 Au et al. ............... 257/355
6,365,932 B1 * 4/2002 Kouno et al. ............... 257/341
6,492,208 B1 * 12/2002 Cheng et al. ............... 438/133
6,521,946 B1    2/2003 Mosher ............... 257/336
6,794,715 B1 * 9/2004 Liu et al. ............... 257/346
6,838,734 B1 * 1/2005 Ker et al. ............... 257/360
6,858,901 B1 * 2/2005 Ker et al. ............... 257/360
2002/0076876 A1 * 6/2002 Ker et al. ............... 438/218

* cited by examiner

*Primary Examiner*—Evan Pert
*Assistant Examiner*—Victor A. Mandala, Jr.
(74) *Attorney, Agent, or Firm*—Saile Ackerman LLC; Stephen B. Ackerman

(57) ABSTRACT

Off-chip driver (OCD) NMOS transistors with ESD protection are formed by interposing an P-ESD implant between the N+ drain regions of OCD NMOS transistors and the N-well such that the P-ESD surrounds a section of the N-well. The P-ESD implant is dosed less than the N+ source/drain implants but higher than the N-well dose. In another embodiment, N-well doping is used along with P-ESD doping, where the P-ESD doping is chosen such that it counterdopes the N-well underneath the N+ drains. The N-well, however, still maintains electrical connection to the N+ drains. This procedure creates a larger surface under the area where the junction breakdown occurs and an increased radius of curvature of the junction. The P-ESD implant is covered by N-type on three sides creating better parasitic bipolar transistor characteristics.

16 Claims, 8 Drawing Sheets

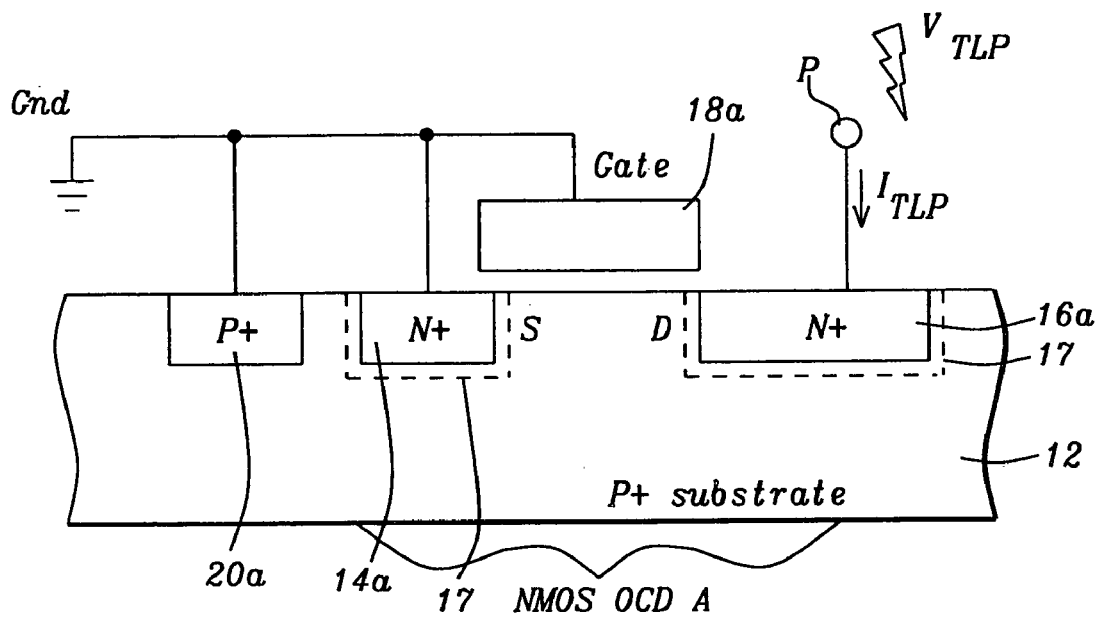
FIG. 1a – Prior Art
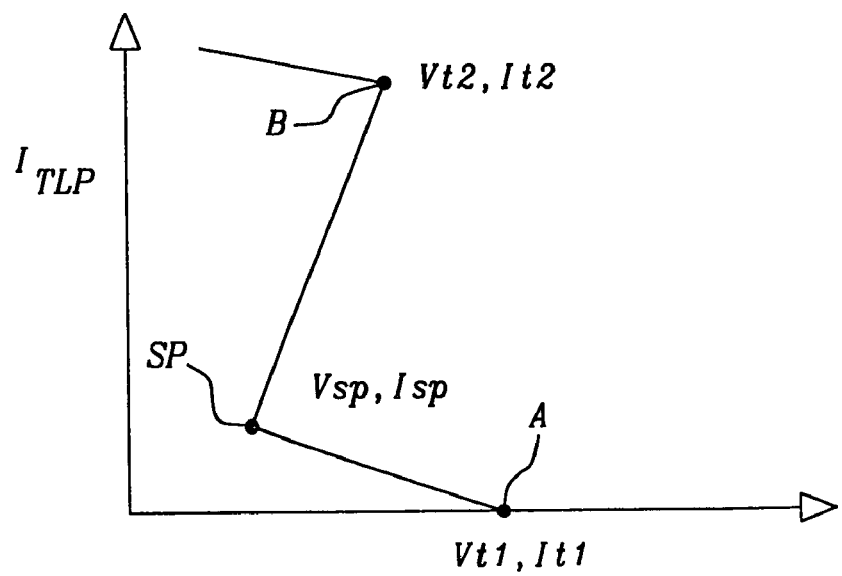
FIG. 1b – Prior Art

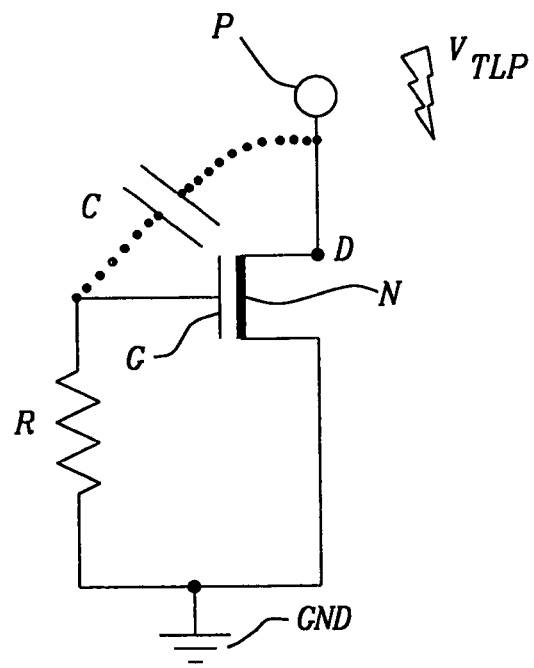
*FIG. 2a – Prior Art*
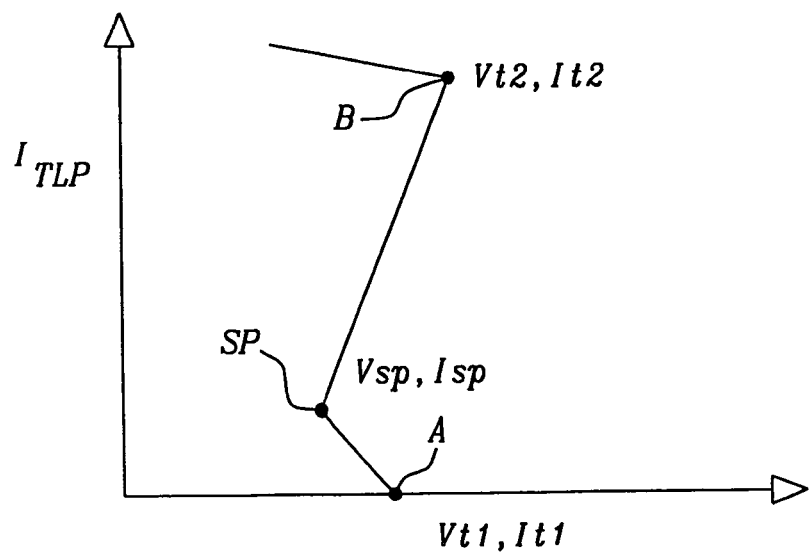
*FIG. 2b – Prior Art*

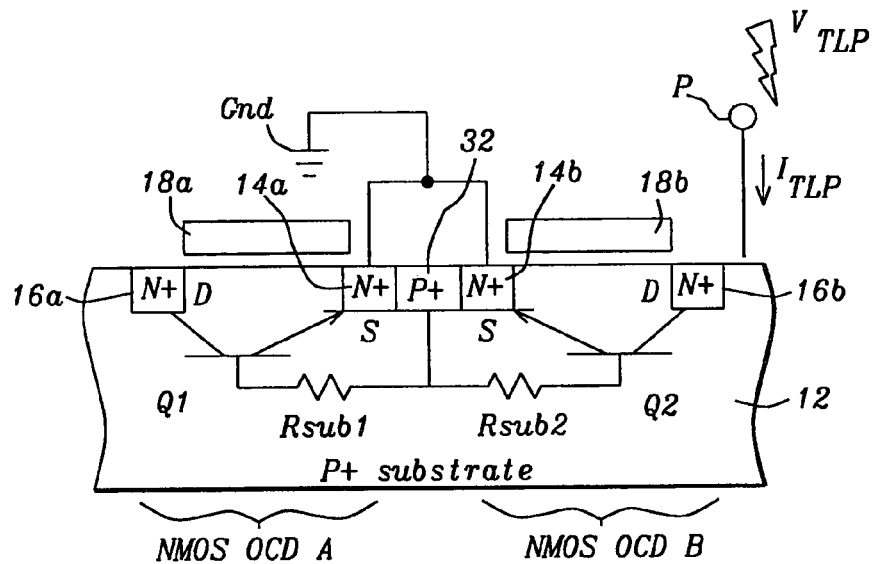
FIG. 3 – Prior Art
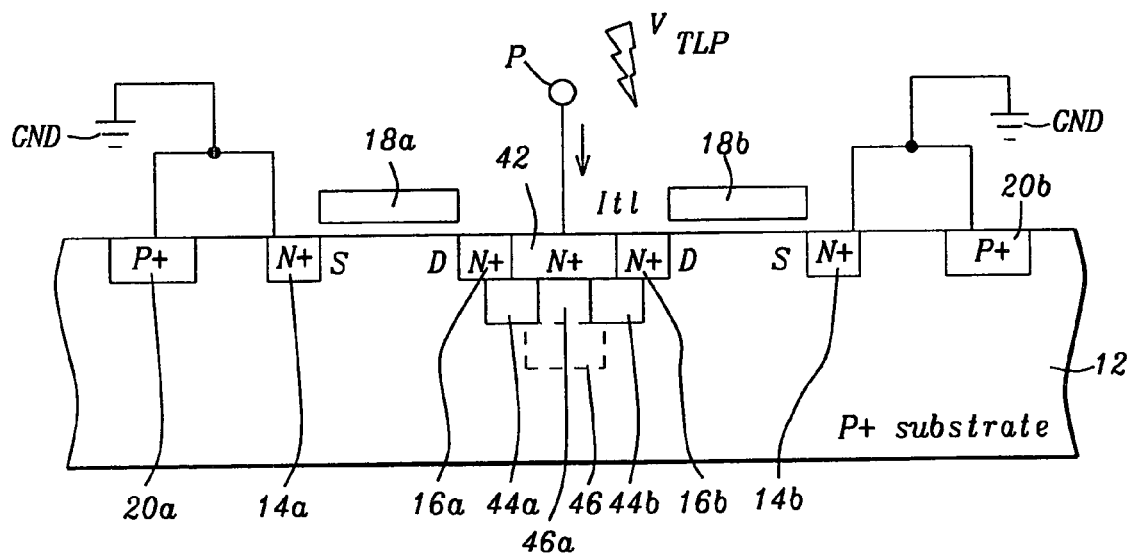
FIG. 4a

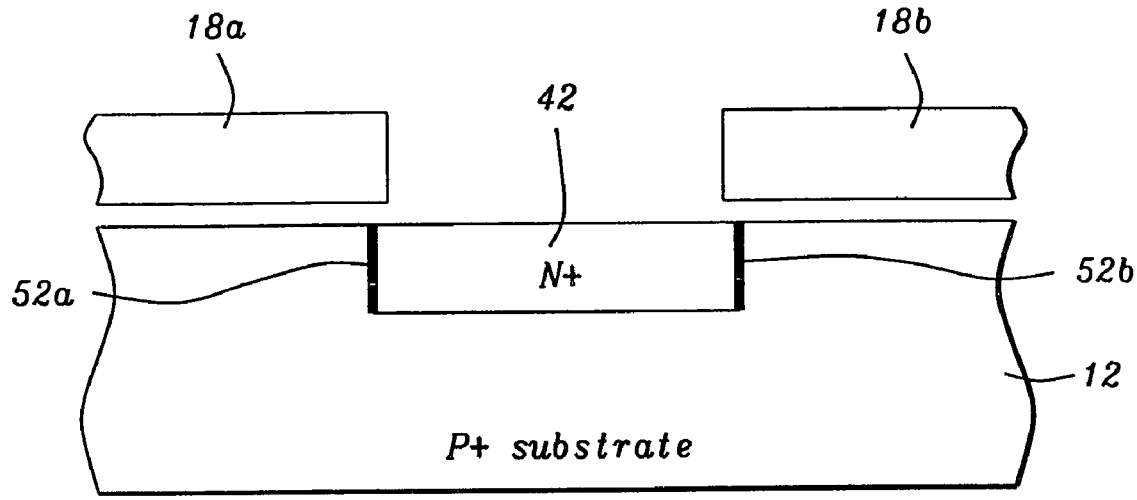
FIG. 5a – Prior Art
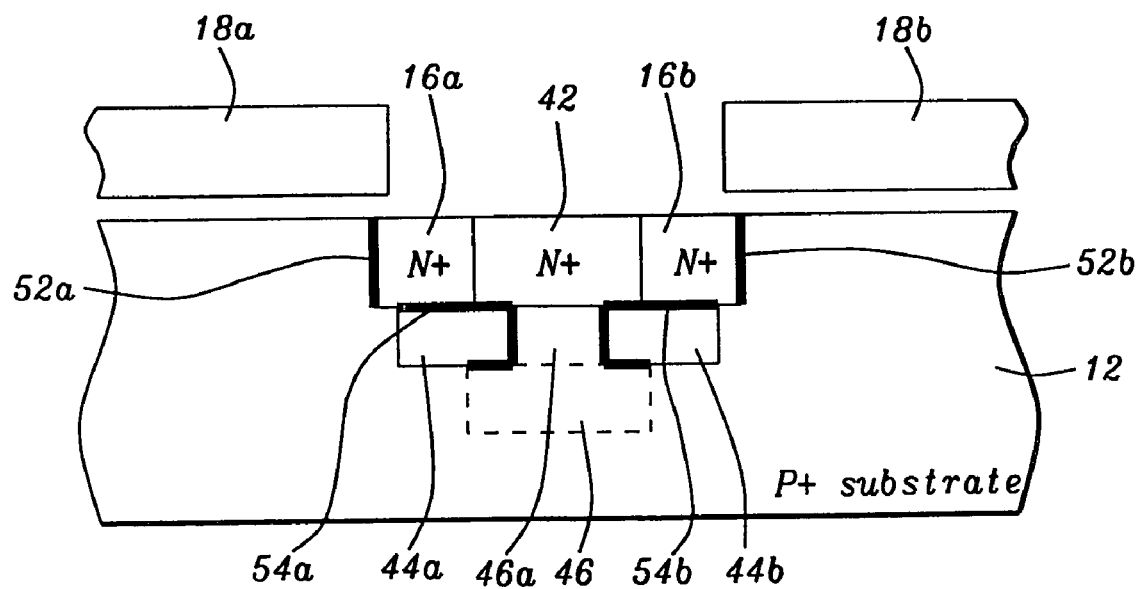
FIG. 5b

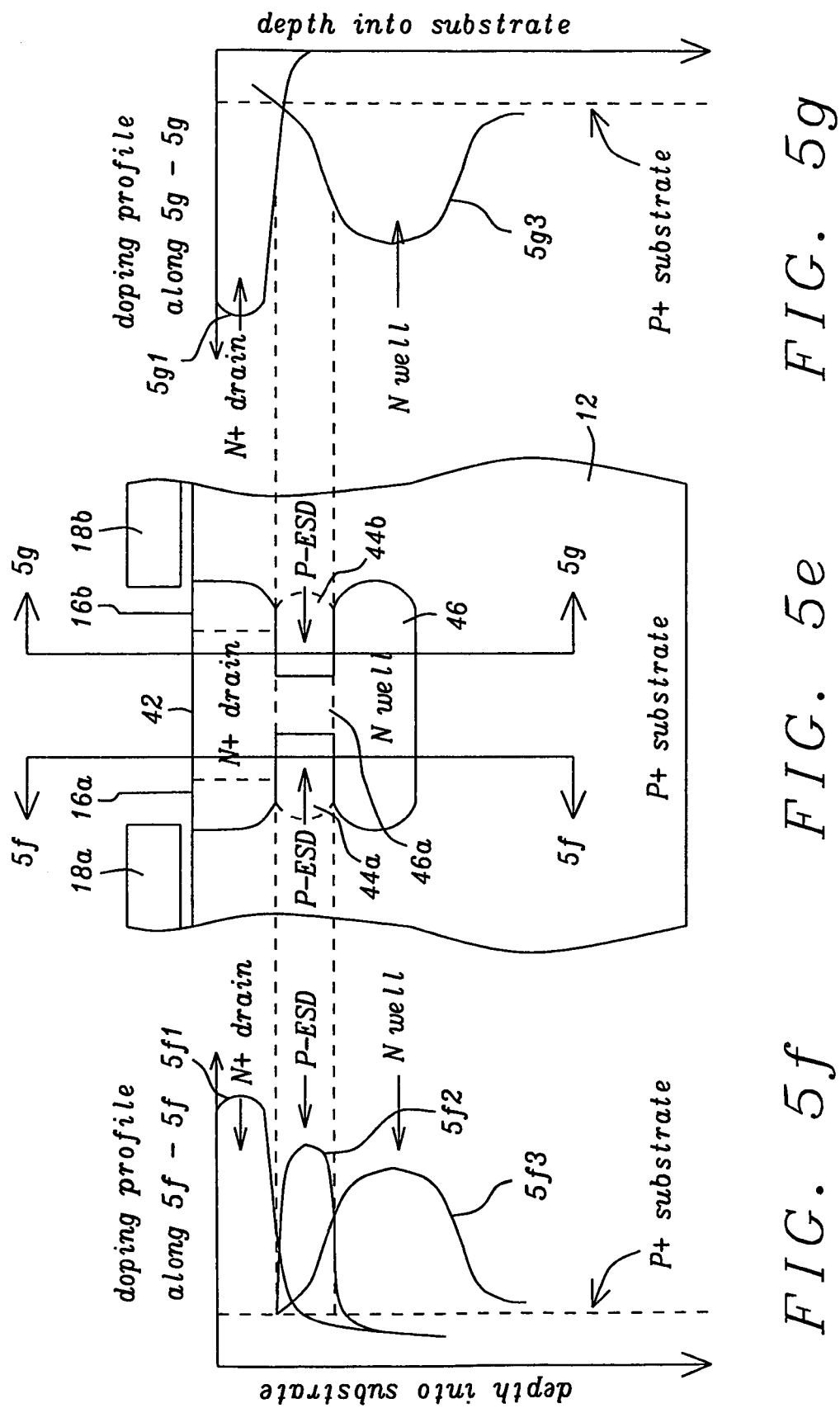

ELECTROSTATIC DISCHARGE PROTECTION DEVICE WITH COMPLEMENTARY DUAL DRAIN IMPLANT

This is a division of patent application Ser. No. 10/662,673 filing date Sep. 15, 2003 now U.S. Pat. No. 6,998,685, Electrostatic Discharge Protection Device With Complementary Dual Drain Implant, assigned to the same assignee as the present invention, which is herein incorporated by reference in its entirety.

BACKGROUND OF THE INVENTION

1. Field of the Invention

The invention relates to the protection of integrated circuits from electrostatic discharge (ESD), and more particularly to structures for the to protection from ESD by adding P-ESD implants and an additional N-well to the drains of an off-chip driver (OCD) NMOS transistor.

2. Description of the Related Art

The protection of integrated circuits from electrostatic discharge (ESD) has received a lot of attention. Many researchers in this field have proposed solutions to protect submicron devices without requiring any increase of silicon real estate. FIG. 1a depicts a cross-section of the related art showing in a P+ substrate 12 an OCD NMOS transistor A with N+ source 14a, drain 16a, a gate 18a, and a P+ type diffusion 20a. The source 14a, the gate 18a, and P+ substrate 12 (via P+ type diffusion 20a) are shown tied to ground (GND). An ESD pulse $V_{TLP}$ at point P is shown discharging into drain 16a with current $I_{TLP}$. An N-ESD implant 17, typically a blanket implant covering the entire active area (source 14a and drain 16a) of the transistor, is applied to make the junction more graded. Such a technique is known to improve the ESD performance of NMOS transistors by reducing the current density in graded junctions and thus improving the value of It2 (second breakdown current). Unfortunately, such a solution does nothing to decrease the avalanche voltage (Vt1) of the transistor, thus making multifinger turn-on very difficult, as illustrated in FIG. 1b where the current $I_{TLP}$ is graphed against the voltage $V_{TLP}$. In this and subsequent graphs, subscript 't1' indicates the avalanche point indicated by Point A, subscript 'sp' indicates the point of snapback indicated by Point SP, and subscript 't2' indicates the second breakdown voltage point indicated by Point B.

Another approach used is depicted in FIG. 2a. Here the gate G of MOSFET transistor N is coupled to the drain D through the RC network (of capacitor C and resistor R) such that part of the ESD voltage is coupled to the gate G to turn on the channel of the MOSFET transistor N. An ESD pulse $V_{TLP}$ at Point P is shown discharging into drain D. This approach, although efficient in reducing the Vt1 of the transistor N, requires additional chip area for the resistor R because it is typically very large. Furthermore, It2 is known to decrease with gate voltage, so the amount of coupling required needs to be accurately known to get good ESD performance of such an arrangement. FIG. 2b depicts the graph of such an arrangement, where the current $I_{TLP}$ is graphed against the voltage $V_{TLP}$. Points A and B depicts the same points as those of FIG. 1b.

FIG. 3 shows the same NMOS OCD A as FIG. 1a but with a second NMOS OCD B comprising source 14b, drain 16b, and gate 18b. The second NMOS OCD B is arranged in a mirror image to the first NMOS OCD A and with a second P+ type diffusion 32 floating in the middle of the N+ sources 14a, 14b. The intent of such a P+ diffusion is to increase the resistance the discharge current must travel to reach the ground potential (GND). This has the benefit of lowering the snapback voltage (Vsp) but has no effect in lowering Vt1 (avalanche voltage). However, lowering the snapback voltage does help in lowering It2 as the power product at breakdown is generally lower. Also shown are parasitic transistors Q1, Q2, and P+ substrate bulk resistors Rsub2 and Rsub2.

The inventions of the related art cited here do not decrease the avalanche breakdown voltage of the ESD devices without the use of additional circuit elements such as resistors. As a result, Vt2 (second breakdown voltage) of the ESD device is oftentimes lower than Vt1, resulting in the issue of multifinger turn-on. Furthermore, it is known that Vt1 is generally higher than the gate oxide breakdown voltage for submicron MOSFETSs and if nothing is done to reduce it will cause gate oxide damage even during the brief time for the transistor to turn on. Additionally, even if the gate oxide is not damaged it will cause significant hot carrier degradation, resulting in poor drive of the OCD as time goes on. The proposed invention is therefore a very desirable improvement in the field of ESD protection.

U.S. Patents relating to the subject of the present invention are:

U.S. Pat. No. 6,521,946 (Mosher) describes a doped region under a drain for ESD protection.

U.S. Pat. No. 6,365,932 (Kouno et al.) discloses a p-type base region in an N-well partly overlapping a deep N+ region.

U.S. Pat. No. 5,543,650 (Au et al.) shows an n-well with P+ implants for ESD protection.

SUMMARY OF THE INVENTION

It is an object of at least one embodiment of the present invention to provide a method and a device to improve the ESD protection of off-chip driver (OCD) NMOS transistors.

It is another object of the present invention to lower the avalanche voltage of OCD NMOS transistors.

It is yet another object of the present invention to reduce the breakdown voltage of the drain/substrate junction during an ESD event.

It is still another object of the present invention to increase the junction area which participates in the avalanche breakdown.

It is a further object of the present invention to have the P-ESD implant extend out of the N-well area to have it exposed to the P+ substrate for electrical connections.

These and many other objects have been achieved by an additional P-ESD implant between the N-well implant and the N+ drain region of the OCD NMOS transistor. The P-ESD implant will be dosed less than the N+ source/drain implants but higher than the N-well dose. In another embodiment of the invention, N-well doping is used in conjunction with the P-ESD doping, where the P-ESD doping is chosen such that it counterdopes the N-well underneath the N+ drain. P-ESD doping is done in such a way that the N-well underneath still maintains electrical connection to N+ drains over it. The P-ESD region is also electrically connected to the P+ substrate. This procedure creates a larger surface under the area where the junction breakdown occurs and an increased radius of curvature of the junction, and results in an enhanced electric field and a breakdown at lower voltage during an ESD event. The P-ESD implants are covered by N-type on three sides which creates more surface area for breakdown and better parasitic bipolar transistor characteristics. The total junction area for breakdown can be further increased by increasing the perimeter surface of the P-ESD implant.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 1a is a cross-sectional view of an off-chip driver (OCD) of the related art.

FIG. 1b is a graph of $V_{TLP}$ vs. $I_{TLP}$ of the OCD of FIG. 1a.

FIG. 2a depicts an RC network used in another approach of the related art to reduce Vt1.

FIG. 2b is a graph of $V_{TLP}$ vs. $I_{TLP}$ which results from the use of the RC network of FIG. 2a.

FIG. 3 is a cross-sectional view of another approach of the related art to an OCD.

FIG. 4a is a cross-sectional view of FIG. 4b of an OCD of a first preferred embodiment of the present invention.

FIG. 5a is a cross-sectional view of an OCD of the related art showing the N+ drain and breakdown areas.

FIG. 5b is a cross-sectional view of the mask layout of FIG. 4b, showing N+ drains, P-ESD implants, the N-well, and additional breakdown areas.

FIG. 5e is a more detailed view of the cross-sectional view of FIG. 4a.

FIG. 5f shows doping profiles through cross-section 5f—5f of FIG. 5e.

FIG. 5g shows doping profiles through cross-section 5g—5g of FIG. 5e.

Use of the same reference number in different figures indicates similar or like elements.

DESCRIPTION OF THE PREFERRED EMBODIMENT

Figure 4B:
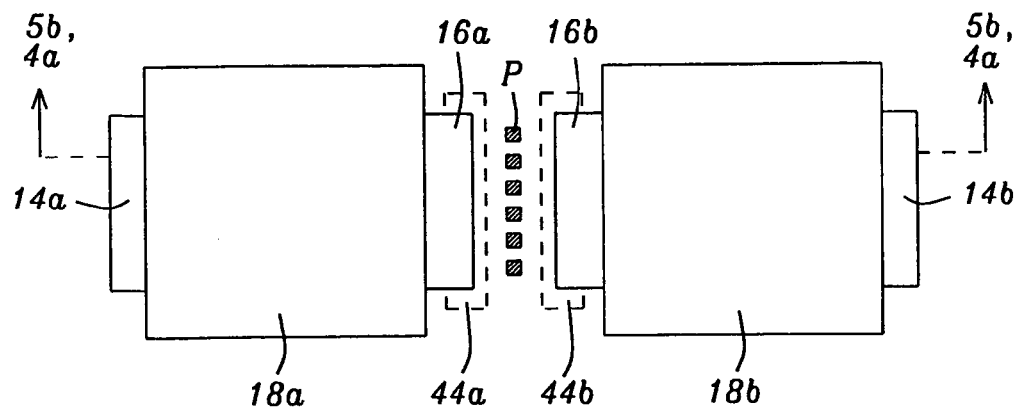
FIG. 4b is a top view of a mask layout of both cross-sectional views FIG. 4a and FIG. 5b.

Referring now to the accompanying drawings FIG. 4a–d, and FIG. 5b–d, there are shown embodiments of the invention. FIG. 4a is a first preferred embodiment of the invention and differs from FIG. 1a by having NMOS OCD A and NMOS OCD B arranged in a mirror symmetry around a vertical line through Point P. Like in FIG. 1a, an ESD pulse $V_{TLP}$ is applied at point P. The device described in this invention lowers the Vt1 of the transistor by implementing additional P-ESD implants 44a, 44b and N-well implants 46, 46a below the N+ drain regions 16a, 16b of the N+ junction 42. The device can be implemented in a first and a second preferred embodiment. In the first preferred embodiment, P-ESD implants 44a, 44b are used underneath drains 16a, 16b, respectively. This arrangement will reduce the breakdown voltage of the drain/substrate (16a/12, 16b/12) junction. The P-ESD implant dose should be less than the N+ source/drain conditions, but higher than the N-well 46, 46a dose for the process. Note that:

Doping of $N+S/D$ >> Doping of $P\text{-}ESD$ >>

Doping of $N\text{-}well$ >> Doping of $P+$ substrate $(\sim 10^{15}\text{ cm}^{-2})\quad(10^{14}\text{ cm}^{-2})\quad(10^{12}-10^{13}\text{ cm}^{-2})$ The arrangement of providing P-ESD implants 44a, 44b for drain regions 16a, 16b is called a complementary dual drain implant.

Still referring to FIG. 4a, P-ESD implant 44a is in direct contact with N+ drain region 16a, N+ junction 42, and N-well implants 46, 46a. P-ESD implant 44b is in direct contact with N+ drain region 16b, N+ junction 42, and N-well implants 46, 46a.

Figure 4C:
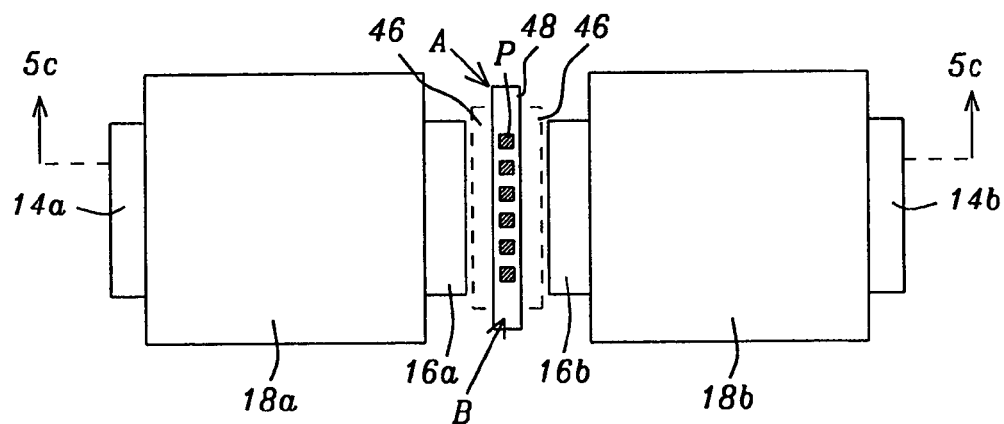
FIG. 4c depicts a top view of a second preferred embodiment of a mask layout of an OCD of the present invention.
Figure 4D:
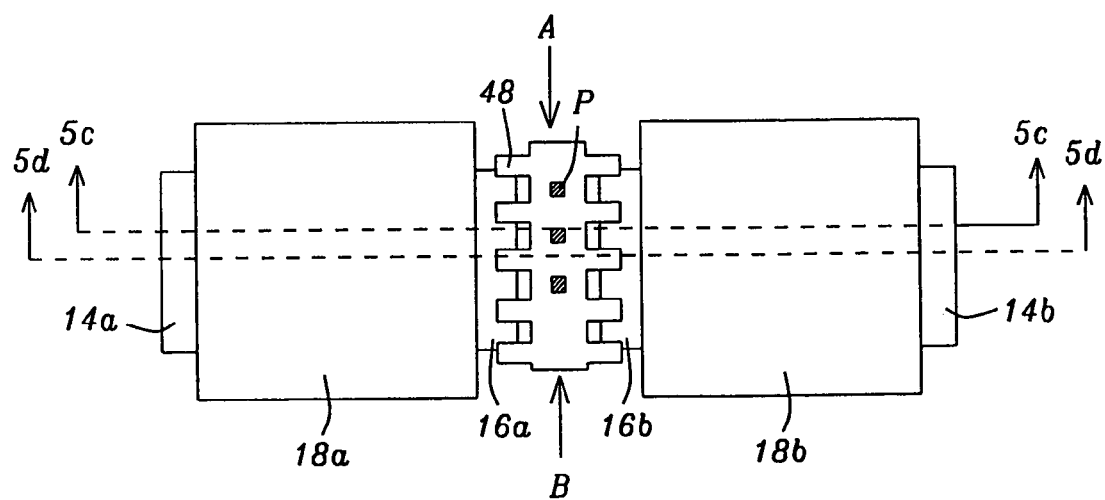
FIG. 4d depicts a top view of a third preferred embodiment of a mask layout of an OCD of the present invention.

In a second preferred embodiment of the invention shown in FIG. 5b as a cross-section and using the same mask layout as FIG. 4b, N-well 46, 46a doping is used in conjunction with P-ESD 44a, 44b doping. P-ESD doping is chosen in such a way so that it counterdopes the N-well 46, 46a underneath the N+ drains 16a, 16b. However, N-well 46 still maintains electrical connection to N+ drains 16a, 16b through the middle section 46a. As a result of such doping, the surface under the drains 16a, 16b, where the junction breakdown occurs, is larger and also the radius of curvature of the junction is much larger, resulting in an enhanced electric field and breakdown at a lower voltage during an ESD event. The P-ESD implants 44a, 44b are required to extend out of the N-well 46 area, so that they are covered by the N-type counterdope 54a, 54b on three sides but exposed to the P+ substrate 12 for electrical connections. This arrangement of N-type counterdope 54a, 54b on three sides results in more surface area for breakdown and better parasitic bipolar characteristics, since the average parasitic transistor base width is smaller because the avalanche area is folded towards the gates 18a, 18b as opposed to FIG. 1a. The total junction area for breakdown can be increased by a combination of layouts as illustrated in FIGS. 4b–d. As illustrated in FIG. 5b, the junction area which participates in the avalanche breakdown is larger with additional junction areas 54a, 54b created by the P-ESD implants 44a, 44b and the N-well 46. In FIG. 5a only the sidewalls 52a, 52b of the N+ junction 42 participates in the junction breakdown. As FIG. 5b illustrates, in addition to the sidewalls 52a, 52b, the participating areas further include the area between the bottom of the drains 16a, 16b of N+ junction 42 and the top of P-ESD implants 44a, 44b, the N-well 46a sidewalls underneath the N+ junction 42, and the N-well 46 areas underneath the P-ESD implants 44a, 44b.

FIG. 4b is a top view of FIG. 4a, where the same reference symbols indicate the same elements. By way of example only, six connections from point P to the N+ junction 42 are shown. FIGS. 4b, 4c, and 4d have exactly the same length of drain N+ junction. What is modified is the location of the N-well 46 and P-ESD implants 44a, 44b (labeled 48 in FIG. 4c and 4d) with the following restraints:

1) the P-ESD must maintain electrical contact with the P substrate.
2) the N-well must be electrically connected to the N+ drains.

3) the P-ESD must be interposed between the N+ drains and the N-well underneath it while leaving intact in some places a connection between the N+ drains and the N-well.
4) the perimeter surface of the P-ESD area between the N+ drains and the N-well must be maximized as much as possible.

Figure 5C:
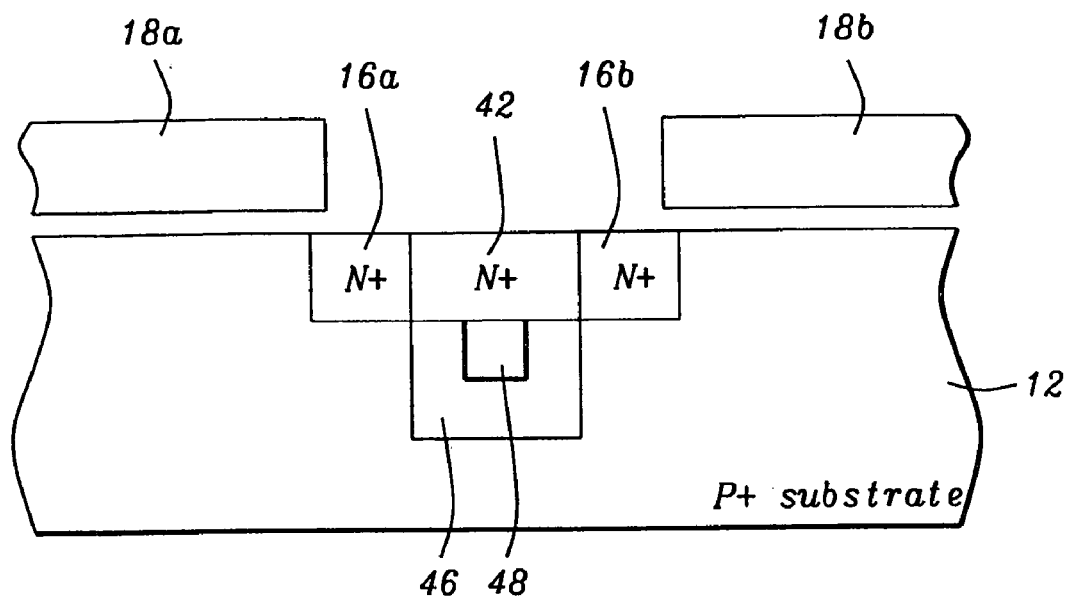
FIG. 5c is a cross-sectional view of the mask layouts of FIG. 4c and FIG. 4d, showing N+ drains, the P-ESD implant, and N-well.
Figure 5D:
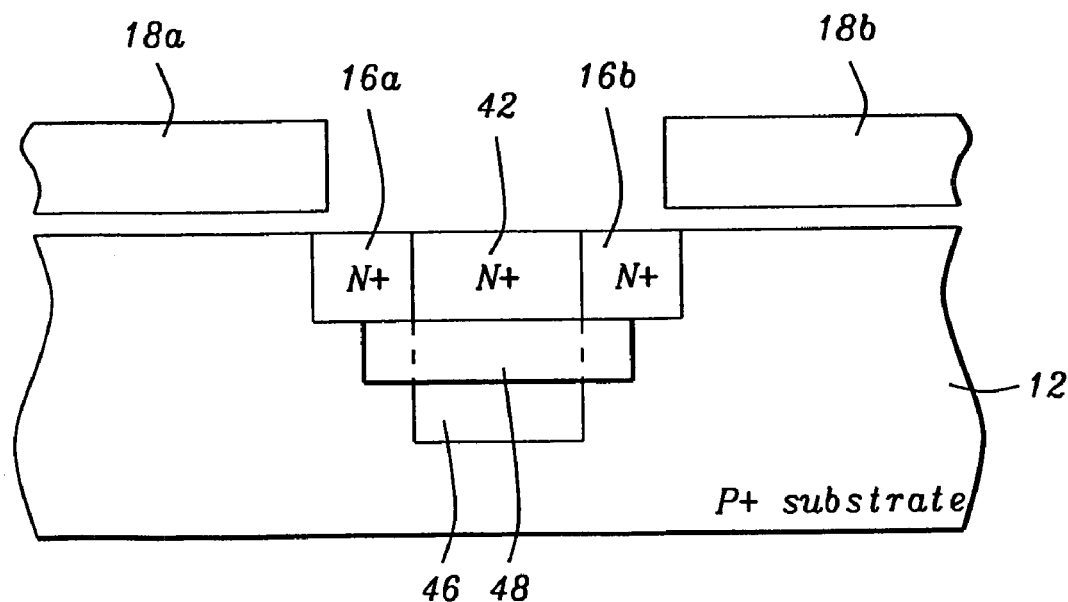
FIG. 5d is another cross-sectional view of the mask layout of FIG. 4d, showing N+ drains, the P-ESD implant, and N-well.

FIGS. 4b, 4c, and 4d all achieve this. Thus, the N+ area is exactly the same in FIGS. 4b, 4c, and 4d. In FIG. 4b, P-ESD has sections 44a and 44b to either side of the central N-well 46, 46a (in agreement with cross-section FIG. 4a). FIG. 4c shows a third preferred embodiment of the present invention, where P-ESD 48 is surrounded by N-well 46 and N+ junction 42 on all sides, while making connections to P+ substrate 12 at the top and bottom edges, see arrows A and B of FIG. 4c. FIG. 5c, the cross-section of FIG. 4c, shows the sides and bottom of P-ESD 48 surrounded by N-well 46. FIG. 4d is a fourth preferred embodiment of the present invention and based on the third preferred embodiment, where a plurality of projections of P-ESD 48 increase the surface area for improved avalanche breakdown. Note that cross-section 5c—5c shows P-ESD 48 embedded in N-well 46, while cross-section 5d—5d shows P-ESD 48 projecting beyond N-well 46 into P+ substrate 12 and in contact with drains 16a, 16b above. As in the other figures, the same numerals/arrows in FIG. 4c and 4d indicate similar or like elements. By way of example only, three connections from point P to the N+ diffusion 42 are shown. See FIGS. 5c and 5d, the cross-sections 5c—5c, 5d—5d of FIG. 4d for details of the variation in the profile of 48.

FIG. 5e is a more detailed view of FIG. 4a with cross-sections 5f and 5g. FIG. 5f shows the doping profile along cross-section 5f—5f, where Curves 5f1, 5f2, and 5f3 show the doping profiles of the N+ drain sections 16a–b, 42, the P-ESD 44a–b, and N-well 46, 46a, respectively, as a function of the depth of P+ substrate 12. FIG. 5g shows the doping profile along cross-section 5g—5g, where Curves 5g1 and 5g3 show the doping profiles of the N+ drain sections 16a–b, 42 and N-well 46, 46a, respectively, as a function of the depth of P+ substrate 12.

Figure 6:
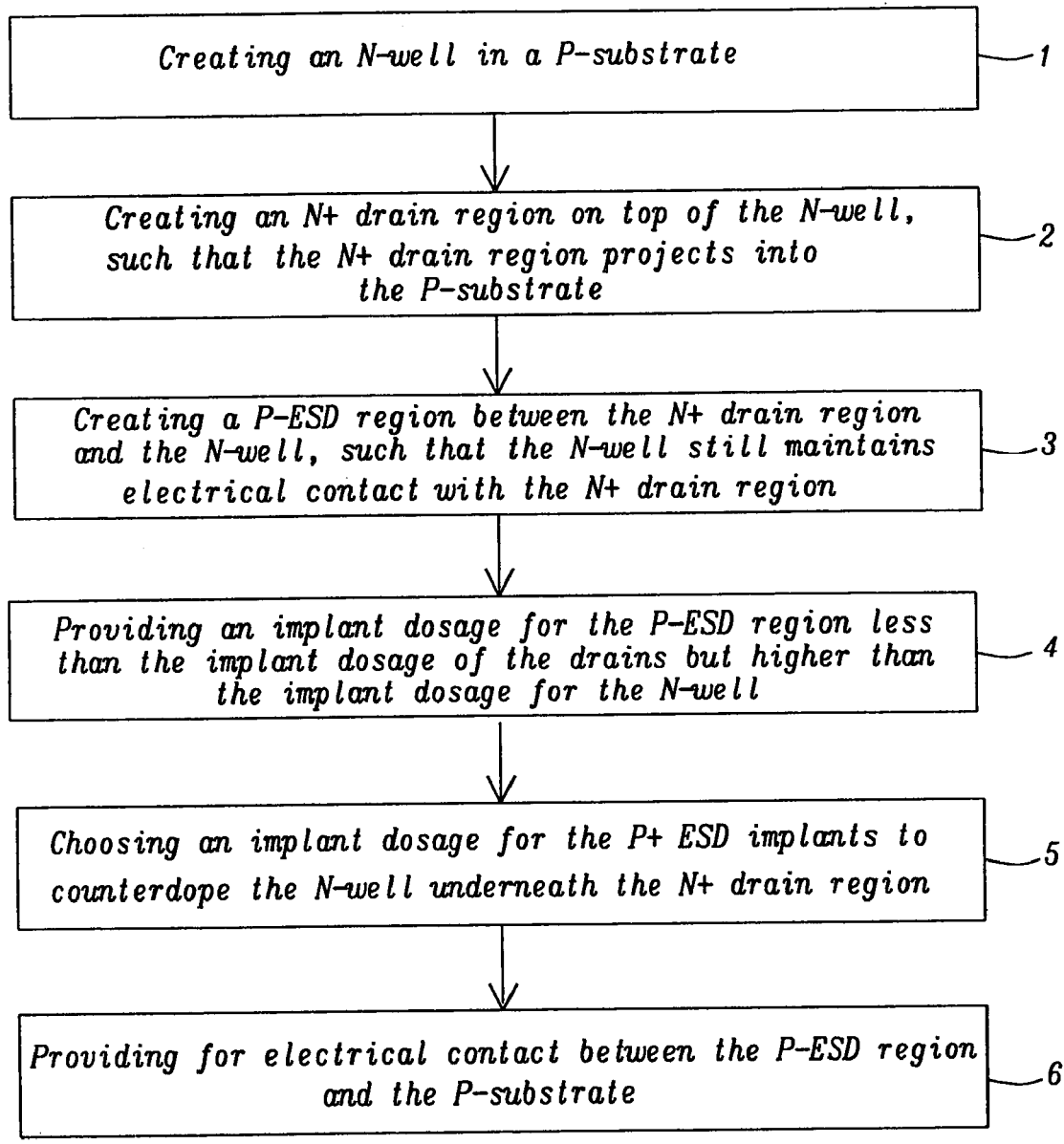
FIG. 6 is a block diagram of the method of the invention.

Block diagram FIG. 6 describes the preferred method of providing ESD protection with complementary dual drain implants:

BLOCK 1 creates an N-well in a P-substrate.
BLOCK 2 creates an N+ drain region on top of the N-well, such that the N+ drain region projects into the P-substrate.
In BLOCK 3 a P-ESD implant is created between the N+ drain region and the N-well, such that the N-well still maintains electrical contact with the N+ drain region.
BLOCK 4 provides an implant dosage for the P-ESD region less than the implant dosage of the drains but higher than the implant dosage for the N-well.
In BLOCK 5 an implant dosage for the P-ESD implants is chosen to counterdope the N-well underneath the N+ drain region.
BLOCK 6 provides for electrical contact between the P-ESD region and the P-substrate.

The P-ESD implant of BLOCK 3 will require a separate masking layer which replaces the traditional ESD implant step.

While the invention has been particularly shown and described with reference to the preferred embodiments thereof, it will be understood by those skilled in the art that various changes in form and details may be made without departing from the spirit and scope of the invention.

What is claimed is:

1. An ESD protection device with complementary dual drain implant comprising:
    a) an N-well implanted in a P-substrate;
    b) an N+ diffusion implanted over said N-well, such that said N+ diffusion extends into said P-substrate on both sides of said N-well;
    c) where said N+ diffusion is shared by the drains of two adjacent NMOS transistors;
    d) a pad coupled conductively to said N+ diffusion between said drains; and
    e) a P-ESD implant interposed between said N+ diffusion and said N-well such that said P-ESD implant is embedded within said N+ diffusion and said N-well, where said P-ESD implant lowers the avalanche voltage of a transistor by reducing the breakdown voltage of the drain/P-substrate junction, and where sections of said embedded P-ESD implant extend at either end of said P-ESD implant beyond said N-well and said N+ diffusion, said P-ESD implant thus coupling electrically to said P-substrate.

2. The ESD protection device of claim 1, wherein the implant dosage for said P-ESD implant is less than the implant dosage for the N+ diffusion but higher than the implant dosage for said N-well.

3. The ESD protection device of claim 1, wherein said N-well is electrically coupled to said N+ diffusion.

4. The ESD protection device of claim 1, wherein segments of said P-ESD implant project beyond said N-well, thus extending into said P-substrate when viewed in cross-section.

5. The ESD protection device of claim 4, wherein said segments of said P-ESD implant projecting beyond said N-well maximize the perimeter surface of said P-ESD implant.

6. The ESD protection device of claim 4, wherein said segments of said P-ESD implant projecting beyond said N-well alternate with segments of said P-ESD which are embedded within said N+ diffusion and said N-well.

7. The ESD protection device of claim 1, wherein said N-well extends in depth beyond the bottom of said P-ESD implant.

8. The ESD protection device of claim 1, wherein said P-ESD implant is in direct contact with said N+ diffusion and said N-well.

9. An ESD protection device with complementary dual drain implants comprising:
    a) an N-well implanted in a P-substrate;
    b) an N+ diffusion implanted over said N-well, such that said N+ diffusion extends into said P-substrate on both sides of said N-well, where said N+ diffusion is shared by the drains of two adjacent NMOS transistors;
    c) a pad coupled conductively to said N+ diffusion between said drains; and
    d) a P-ESD implant interposed between said N+ diffusion and said N-well such that said P-ESD implant is embedded within said N+ diffusion and said N-well, where the P-ESD implant dosage is chosen in such a way as to counterdope said N-well, wherein segments of said P-ESD implant, by projecting beyond said N-well, extend into said P-substrate when viewed in cross-section.

10. The method of providing ESD protection with complementary dual drain implants, comprising the steps of:
  a) creating an N-well in a P-substrate;
  b) creating an N+ drain region over said N-well, where said N+ drain region projects into said P-substrate on either side of said N-well;
  c) creating a P-ESD region between said N+ drain and said N-well, such that said N-well still maintains an electrical connection to said N+ drain region; and
  e) providing an implant dosage for said P-ESD implants less than the implant dosage of said N+ drain region but higher than the implant dosage for said N-well.

11. The method of claim 10, wherein said implant dosage for said P-ESD implants is chosen such as to counterdope said N-well underneath said N+ diffusion.

12. The method of claim 10, wherein said P-ESD implant makes electrical contact with said P-substrate.

13. The method of providing ESD protection with complementary dual drain implants, comprising the steps of:
  a) creating an N-well in a P-substrate;
  b) creating an N+ drain region over said N-well, where said N+ drain region projects into said P-substrate on either side of said N-well;
  c) creating a P-ESD region between said N+ drain and said N-well, such that first areas of said P-ESD region are surrounded by said N+ drain and N-well; and
  e) providing an implant dosage for said P-ESD implants less than the implant dosage of said N+ drain region but higher than the implant dosage for said N-well.

14. The method of claim 13, wherein said implant dosage for said P-ESD implants is chosen such as to counterdope said N-well underneath said N+ diffusion.

15. The method of claim 13, wherein second areas of said P-ESD implant project beyond said N-well into said P-substrate.

16. The method of claim 15, wherein said second areas of said P-ESD implant make electrical contact with said P-substrate.

* * * * *